(12) United States Patent
Inada et al.

(10) Patent No.: US 7,292,909 B2
(45) Date of Patent: Nov. 6, 2007

(54) SUBSTRATE PROCESSING APPARATUS AND MANAGEMENT METHOD

(75) Inventors: Tatsuhiko Inada, Kyoto (JP); Hiroyuki Tsujino, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 384 days.

(21) Appl. No.: 10/993,956

(22) Filed: Nov. 19, 2004

(65) Prior Publication Data
US 2005/0130453 A1    Jun. 16, 2005

(30) Foreign Application Priority Data
Dec. 10, 2003    (JP)    ............... 2003-411552

(51) Int. Cl.
*G06F 7/00*    (2006.01)
*G06F 19/00*    (2006.01)
*H01L 21/677*    (2006.01)

(52) U.S. Cl. ............. 700/218; 700/213; 700/112; 414/935; 414/936; 414/217

(58) Field of Classification Search ............... 700/218, 700/112, 213, 214; 414/935, 936, 217, 939
See application file for complete search history.

(56) References Cited

U.S. PATENT DOCUMENTS

| 5,769,952 | A | * | 6/1998 | Komino | ............... | 118/733 |
| 6,095,741 | A | * | 8/2000 | Kroeker et al. | ............ | 414/217 |
| 6,267,545 | B1 | * | 7/2001 | Mooring et al. | ............ | 414/217 |
| 2001/0024609 | A1 | * | 9/2001 | White et al. | ............... | 414/217 |
| 2002/0070371 | A1 | * | 6/2002 | Kroeker et al. | ............ | 251/195 |
| 2003/0031537 | A1 | * | 2/2003 | Tokunaga | ................ | 414/217 |

FOREIGN PATENT DOCUMENTS

JP    2000-252345    9/2000

* cited by examiner

*Primary Examiner*—Gene O. Crawford
*Assistant Examiner*—Ramya G. Prakasam
(74) *Attorney, Agent, or Firm*—Ostrolenk, Faber, Gerb & Soffen, LLP

(57) ABSTRACT

A variety of maintenance work is performed for each of operation units in a substrate processing apparatus. Doors are provided at given positions on sides of an apparatus space, each of which is provided with an interlock switch. An interlock release unit is provided near each of the doors for disabling the function by the interlock switch, and for placing a specific operation unit of the operation units in the apparatus space in an off state, while holding the other operation units in an on state. Re-operation instruction units are provided at given positions on the sides of the apparatus space for placing the specific operation unit in an on state that has been placed in an off state by the manipulation of the interlock release unit.

17 Claims, 7 Drawing Sheets

| DANGER LEVEL | 4 | VARIOUS TYPES OF TRANSPORT ROBOTS |
| --- | --- | --- |
| | 3 | CHEMICAL PROCESSORS USING CHEMICALS HAVING A HIGH POSSIBILITY OF HARMING A HUMAN BODY<br>PROCESSORS USING LASERS OF SECOND CLASS OR HIGHER |
| | 2 | CHEMICAL PROCESSORS USING CHEMICALS HAVING A LOW POSSIBLITY OF HARMING A HUMAN BODY |
| | 1 | WATER PROCESSORS |

SUBSTRATE PROCESSING APPARATUS AND MANAGEMENT METHOD

BACKGROUND OF THE INVENTION

1. Field of the Invention

The present invention relates to a substrate processing apparatus that performs a variety of processings to a substrate, and a management method therefor.

2. Description of the Background Art

A substrate processing apparatus has conventionally been employed for performing a variety of processings to a substrate, such as a semiconductor wafer, glass substrate for photomask, glass substrate for liquid crystal display, or glass substrate for optical disk. The fabrication process of a semiconductor device, for example, employs a substrate processing apparatus in which each of a series of processings is unitized, and a plurality of processing units are integrated for increased productivity.

Usually, a substrate is successively subjected to a plurality of different processings in such substrate processing apparatus. For this reason, the substrate processing apparatus comprises a variety of processing units such as a cleaning unit or exposure unit, and a substrate transport robot that transports the substrate between one processing unit and another.

Also, the foregoing substrate processing apparatus has doors that allow an operator to enter into the substrate processing apparatus for maintenance of the processing units, substrate transport robot and the like.

This substrate processing apparatus has an interlock function that cuts off the power supply to the entire apparatus upon opening of any of the doors, in order to prevent the operator from being exposed to dangers, for example, getting caught in the substrate transport robot, in cases where he/she inadvertently opens the door to enter the substrate processing apparatus. The interlock function is operated by interlock switches on the doors.

When, however, the interlock function operates upon opening of the door to turn off the entire substrate processing apparatus, the operator cannot in some cases perform maintenance of the processing units and substrate transport robot. An example of such maintenance is teaching of the substrate transport robot (teaching operation).

For this reason, the foregoing substrate processing apparatus has an interlock release switch that temporarily releases the interlock function in order to prevent the power supply to the entire substrate processing apparatus from being cut off upon opening of the door.

By the way, among the foregoing processing units and substrate transport robots, there are some which may pose danger to the operator during operation, and others which may not.

As an example, a processing unit using a chemical may harm a human body with the chemical used. A processing unit using a laser may also harm a human body with its laser. Further, if an operator inadvertently approaches a substrate transport robot, he/she may possibly get caught in the moving substrate transport robot.

The processing units, substrate transport robot, or the like which may cause danger to the operator will be termed danger sources. Provision of a security device have conventionally been made for each of such danger sources (refer to JP2000-252345 A, for example)

Add to this, only the personnel trained in each of the danger sources (danger-source personnel) are conventionally permitted to perform maintenance of such a danger source, in order to ensure the security of an operator.

When, however, the danger-source personnel conventionally perform maintenance of a specific danger source by releasing the interlock function, they conduct the work with other danger sources in operation. Thus, conventional security devices do not always ensure the security of the operator with a plurality of danger sources simultaneously operating.

Further, in conventional substrate processing apparatus, no one except danger-source personnel have been able to perform maintenance, because persons other than the danger-source personnel cannot release the interlock function even if they wish to perform maintenance of an operating processing unit or substrate transport robot that is not a danger source.

This imposes restrictions on the working personnel of the maintenance of processing units or substrate transport robots that are not danger sources, which has been pointed out as a cause of lowering the maintenance efficiency.

SUMMARY OF THE INVENTION

It is an object of the present invention to provide a substrate processing apparatus and a management method therefor in which the security of an operator can be reliably ensured, and the maintenance can be efficiently performed.

A substrate processing apparatus according to one aspect of the present invention comprises: a plurality of operation units provided in an apparatus space including a process space for performing given processing to a substrate and a transport space for transporting the substrate, to perform a given processing or a transport operation to the substrate; a door that allows a person to enter into the apparatus space; a stop device that stops the plurality of operation units upon opening of the door; a disabling device for placing the operation of the stop device in a disabled state, while placing a predetermined operation unit of the plurality of operation units in a stopped state; and an operation instruction device for re-operating the predetermined operation unit that has been placed in a disabled state by the disabling device.

In the substrate processing apparatus, although the plurality of operation units are stopped by the stop device upon opening the door, the operator can place the operation of the stop device in a disabled state with the disabling device, while placing the predetermined operation unit of the plurality of operation units in a stopped state. This prevents the operator from the potential danger caused by the operation of the predetermined operation unit, thereby ensuring the security of the operator. Also, with the predetermined operation unit being stopped, even an operator without special training on the predetermined operation unit can safely perform maintenance of the operation units except the predetermined operation unit, when he/she wishes. As a result, the maintenance can be efficiently performed.

Moreover, the operator may instruct the re-operation of the predetermined operation unit with the operation instruction device for re-operation of the predetermined operation unit. This allows the operator to perform maintenance of the predetermined operation unit.

The operation instruction device may further comprise a first manipulator for instructing the re-operation of the predetermined operation unit that has been placed in a stopped state, the first manipulator being provided in the apparatus space. This allows the operator to instruct the re-operation of the predetermined operation unit by manipulating the first manipulator inside the apparatus space. As a result, the operator can reliably identify his/her target operation unit.

The disabling device may comprise a second manipulator for instructing settings of the operations of the stop device and the predetermined operation unit, the second manipulator being provided outside the apparatus space. This allows the operator to instruct settings of the operations of the stop device and the predetermined operation unit by manipulating the second manipulator outside the apparatus space. As a result, the operator is prevented from danger.

The substrate processing apparatus may further comprise a controller that controls the operation of the stop device in a disabled state while controlling the predetermined operation unit in a stopped state in response to the settings made by the disabling device, and re-operates the predetermined operation unit in response to the instruction of re-operation by the operation instruction device.

In this case, the controller controls the operation of the stop device in a disabled state while controlling the predetermined operation unit in a stopped state in response to the settings made by the disabling device, which prevents the operator from the potential danger caused by the operation of the predetermined operation unit, ensuring the security of the operator.

Moreover, the operator may instruct the re-operation of the predetermined operation unit with the operation instruction device for re-operation of the predetermined operation unit. The operator can therefore perform maintenance of the predetermined operation unit.

Danger levels may be preset for the plurality of operation units, respectively, and the predetermined operation unit may have a danger level higher than the other operation units.

In this case, although the plurality of operation units are stopped by the stop device upon opening of the door, the operation of the stop device can be placed in a disabled state by the disabling device, and simultaneously, an operation unit having a high danger level of the plurality of operation units can be placed in a stopped state. This prevents the operator from the potential danger caused by the operation of the operation unit having a high danger level, thereby ensuring the security of the operator. Also, with the operation unit having a high danger level being stopped, even an operator without special training on the operation unit having a high danger level can safely perform maintenance of the operation units of low danger levels, when he/she wishes. As a result, the maintenance can be efficiently performed.

Moreover, the operator may instruct the re-operation of the operation unit having a high danger level with the operation instruction device for re-operation of the operation unit having a high danger level. This allows the operator to perform maintenance of the operation unit having a high danger level.

The predetermined operation unit may include a transport device that transports a substrate.

In this case, although the plurality of operation units are stopped by the stop device upon opening of the door, the operation of the stop device can be placed in a disabled state, and simultaneously, the transport device that transports a substrate of the plurality of operation units can be placed in a stopped state by the disabling device. This prevents the operator from the potential danger caused by the operation of the transport device, thereby ensuring the security of the operator. Also, with the transport device being stopped, even an operator without special training on the transport device can safely perform maintenance of the operation units except the transport device, when he/she wishes. As a result, the maintenance can be efficiently performed.

Moreover, the operator may instruct the re-operation of the transport device with the operation instruction device for re-operation of the transport device. This allows the operator to perform maintenance of the transport device.

The predetermined operation unit may include a processor that performs processing using a chemical.

In this case, although the plurality of operation units are stopped by the stop device upon opening of the door, the operation of the stop device can be placed in a disabled state, and simultaneously, the processor that performs processing using a chemical of the plurality of operation units can be placed in a stopped state by the disabling device. This prevents the operator from the potential danger caused by the operation of the processor that performs processing using a chemical, thereby ensuring the security of the operator. Also, with the processor that performs processing using a chemical being stopped, even an operator without special training on the processor that performs processing using a chemical can safely perform maintenance of the operation units except the processor that performs processing using a chemical, when he/she wishes. As a result, the maintenance can be efficiently performed.

Moreover, the operator may instruct the re-operation of the processor that performs processing using a chemical with the operation instruction device for the re-operation thereof. This allows the operator to perform maintenance of the processor that performs processing using a chemical.

The predetermined operation unit may include a processor that performs processing using laser light.

In this case, although the plurality of operation units are stopped by the stop device upon opening of the door, the operation of the stop device can be placed in a disabled state, and simultaneously, the processor that performs processing using laser light of the plurality of operation units can be placed in a stopped state by the disabling device. This prevents the operator from the potential danger caused by the operation of the processor that performs processing using laser light, thereby ensuring the security of the operator. Also, with the processor that performs processing using laser light being stopped, even an operator without special training on the processor that performs processing using laser light can safely perform maintenance of the operation units except the processor that performs processing using laser light, when he/she wishes. As a result, the maintenance can be efficiently performed.

Moreover, the operator may instruct the re-operation of the processor that performs processing using laser light with the operation instruction device for the re-operation thereof. This allows the operator to perform maintenance of the processor that performs processing using laser light.

The predetermined operation unit may include a plurality of operation units, and the operation instruction device may include a plurality of operation instruction devices provided for the plurality of operation units, respectively.

In this case, because the plurality of operation instruction devices are provided for the plurality of operation units, respectively, the operator is prevented from erroneously re-operating operation units other than the operation unit of which he/she is to perform maintenance.

A substrate processing apparatus according to another aspect of the present invention comprises: a plurality of operation units provided in an apparatus space including a process space for performing given processing to a substrate and a transport space for transporting the substrate, to perform a given processing or a transport operation to the substrate; a door that allows a person to enter into the apparatus space; a stop device that stops the plurality of operation units upon opening of the door; a disabling device that places the operation of the stop device in a disabled state, while placing a predetermined operation unit of the plurality of operation units in a stopped state after the elapse of a given time since the opening of the door; and an operation instruction device for re-operating the predetermined operation unit that has been placed in a stopped state by the disabling device.

In the substrate processing apparatus, although the plurality of operation units are stopped by the stop device upon opening of the door, after the elapse of a given time since the opening of the door, the operation of the stop device is placed in a disabled state, while the predetermined operation unit of the plurality of operation units is placed in a stopped state by the disabling device. This prevents the operator from the potential danger caused by the operation of the predetermined operation unit, thereby ensuring the security of the operator. Also, with the predetermined operation unit being stopped, even an operator without special training on the predetermined operation unit can safely perform maintenance of the operation units except the predetermined operation unit, when he/she wishes. As a result, the maintenance can be efficiently performed.

Moreover, the operator may instruct the re-operation of the predetermined operation unit with the operation instruction device for re-operation of the predetermined operation unit. This allows the operator to perform maintenance of the predetermined operation unit.

The operation instruction device may further comprise a first manipulator for instructing the re-operation of the predetermined operation unit that has been placed in a stopped state, the first manipulator being provided in the apparatus space. This allows the operator to instruct the re-operation of the predetermined operation unit by manipulating the first manipulator inside the apparatus space. As a result, the operator can reliably identify his/her target operation unit.

The substrate processing apparatus may further comprise a controller that controls the operation of the stop device in a disabled state while controlling the predetermined operation unit in a stopped state in response to the settings made by the disabling device, and re-operates the predetermined operation unit in response to the instruction of re-operation by the operation instruction device.

In this case, the controller controls the operation of the stop device in a disabled state while controlling the predetermined operation unit in a stopped state in response to the settings made by the disabling device, which prevents the operator from the potential danger caused by the operation of the predetermined operation unit, ensuring the security of the operator.

Moreover, the operator may instruct the re-operation of the predetermined operation unit with the operation instruction device for re-operation of the predetermined operation unit. The operator can therefore perform maintenance of the predetermined operation unit.

Danger levels may be preset for the plurality of operation units, respectively, and the predetermined operation unit may have a danger level higher than the other operation units.

In this case, although the plurality of operation units are stopped by the stop device upon opening of the door, the operation of the stop device can be placed in a disabled state, and simultaneously, an operation unit having a high danger level of the plurality of operation units can be placed in a stopped state by the disabling device. This prevents the operator from the potential danger caused by the operation of the operation unit having a high danger level, thereby ensuring the security of the operator. Also, with the operation unit having a high danger level being stopped, even an operator without special training on the operation unit having a high danger level can safely perform the maintenance of the operation units of low danger levels, when he/she wishes. As a result, the maintenance can be efficiently performed.

Moreover, the operator may instruct the re-operation of the operation unit having a high danger level with the operation instruction device for re-operation of the operation unit having a high danger level. This allows the operator to perform maintenance of the operation unit having a high danger level.

The predetermined operation unit may include a transport device that transports a substrate.

In this case, although the plurality of operation units are stopped by the stop device upon opening of the door, the operation of the stop device can be placed in a disabled state, and simultaneously, the transport device that transports a substrate of the plurality of operation units can be placed in a stopped state by the disabling device. This prevents the operator from the potential danger caused by the operation of the transport device, thereby ensuring the security of the operator. Also, with the transport device being stopped, even an operator without special training on the transport device can safely perform maintenance of the operation units except the transport device, when he/she wishes. As a result, the maintenance can be efficiently performed.

Moreover, the operator may instruct the re-operation of the transport device with the operation instruction device for re-operation of the transport device. This allows the operator to perform maintenance of the transport device.

The predetermined operation unit may include a processor that performs processing using a chemical.

In this case, although the plurality of operation units are stopped by the stop device upon opening of the door, the operation of the stop device can be placed in a disabled state, and simultaneously, the processor that performs processing using a chemical of the plurality of operation units can be placed in a stopped state by the disabling device. This prevents the operator from the potential danger caused by the operation of the processor that performs processing using a chemical, thereby ensuring the security of the operator. Also, with the processor that performs processing using a chemical being stopped, even an operator without special training on the processor that performs processing using a chemical can safely perform maintenance of the operation units except the processor that performs processing using a chemical, when he/she wishes. As a result, the maintenance can be efficiently performed.

Moreover, the operator may instruct the re-operation of the processor that performs processing using a chemical with the operation instruction device for the re-operation thereof. This allows the operator to perform maintenance of the processor that performs processing using a chemical.

The predetermined operation unit may include a processor that performs processing using laser light.

In this case, although the plurality of operation units are stopped by the stop device upon opening of the door, the operation of the stop device can be placed in a disabled state, and simultaneously, the processor that performs processing using laser light of the plurality of operation units can be placed in a stopped state by the disabling device. This prevents the operator from the potential danger caused by the operation of the processor that performs processing using laser light, thereby ensuring the security of the operator. Also, with the processor that performs processing using laser light being stopped, even an operator without special training on the processor that performs processing using laser light can safely perform maintenance of the operation units except the processor that performs processing using laser light, when he/she wishes. As a result, the maintenance can be efficiently performed.

Moreover, the operator may instruct the re-operation of the processor that performs processing using laser light with the operation instruction device for the re-operation thereof. This allows the operator to perform maintenance of the processor that performs processing using laser light.

The predetermined operation unit may include a plurality of operation units, and the operation instruction device may include a plurality of operation instruction devices provided for the plurality of operation units, respectively.

In this case, because the plurality of operation instruction devices are provided for the plurality of operation units, respectively, the operator is prevented from erroneously re-operating operation units other than the operation unit of which he/she is to perform maintenance.

A management method for a substrate processing apparatus according to still another aspect of the present invention, wherein the substrate processing apparatus comprises: a plurality of operation units provided in an apparatus space including a process space for performing given processing to a substrate and a transport space for transporting the substrate, to perform a given processing or a transport operation to the substrate; a door that allows a person to enter into the apparatus space; and a stop device that stops the plurality of operation units upon opening of the door, comprises the steps of: placing the operation of the stop device in a disabled state while placing a predetermined operation unit of the plurality of operation units in a stopped state; and re-operating the predetermined operation unit that has been placed in a stopped state.

In the management method for the substrate processing apparatus, although the plurality of operation units are stopped by the stop device upon opening of the door, the operation of the stop device can be placed in a disabled state, while the predetermined operation unit of the plurality of operation units can be placed in a stopped state. This prevents an operator from the potential danger caused by the operation of the predetermined operation unit, thereby ensuring the security of the operator. Also, with the predetermined operation unit being stopped, even an operator without special training on the predetermined operation unit can safely perform maintenance of the operation units except the predetermined operation unit, when he/she wishes. As a result, the maintenance can be efficiently performed.

Moreover, because the predetermined operation unit is re-operated, the operator can perform maintenance of the predetermined operation unit.

A management method for a substrate processing apparatus according to yet another aspect of the present invention, wherein the substrate processing apparatus comprises: a plurality of operation units provided in an apparatus space including a process space for performing given processing to a substrate and a transport space for transporting the substrate, to perform a given processing or a transport operation to the substrate; a door that allows a person to enter into the apparatus space; and a stop device that stops the plurality of operation units upon opening of the door, comprises the steps of: placing the operation of the stop device in a disabled state while placing a predetermined operation unit of the plurality of operation units in a stopped state after the elapse of a given time since the opening of the door; and re-operating the predetermined operation unit that has been placed in a stopped state.

In the management method for the substrate processing apparatus, although the plurality of operation units are stopped by the stop device upon opening of the door, after the elapse of a given time since the opening of the door, the operation of the stop device can be placed in a disabled state, while the predetermined operation unit of the plurality of operation units can be placed in a stopped state. This prevents the operator from the potential danger caused by the operation of the predetermined operation unit, thereby ensuring the security of the operator. Also, with the predetermined operation unit being stopped, even an operator without special training on the predetermined operation unit can safely perform maintenance of the operation units except the predetermined operation unit, when he/she wishes. As a result, the maintenance can be efficiently performed.

Moreover, because the predetermined operation unit is re-operated, the operator can perform maintenance of the predetermined operation unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram illustrative of an example of danger levels according to an embodiment of the present invention.

DESCRIPTION OF THE PREFERRED EMBODIMENTS

A substrate processing apparatus according to an embodiment of the present invention and a management method therefor will, hereinafter, be described with reference to FIGS. 1 to 7.

A substrate as used in the specification refers to a semiconductor wafer, glass substrate for liquid crystal display, glass substrate for PDP (Plasma Display Panel), glass substrate for photomask, glass substrate for optical disk, or the like.

Figure 1:
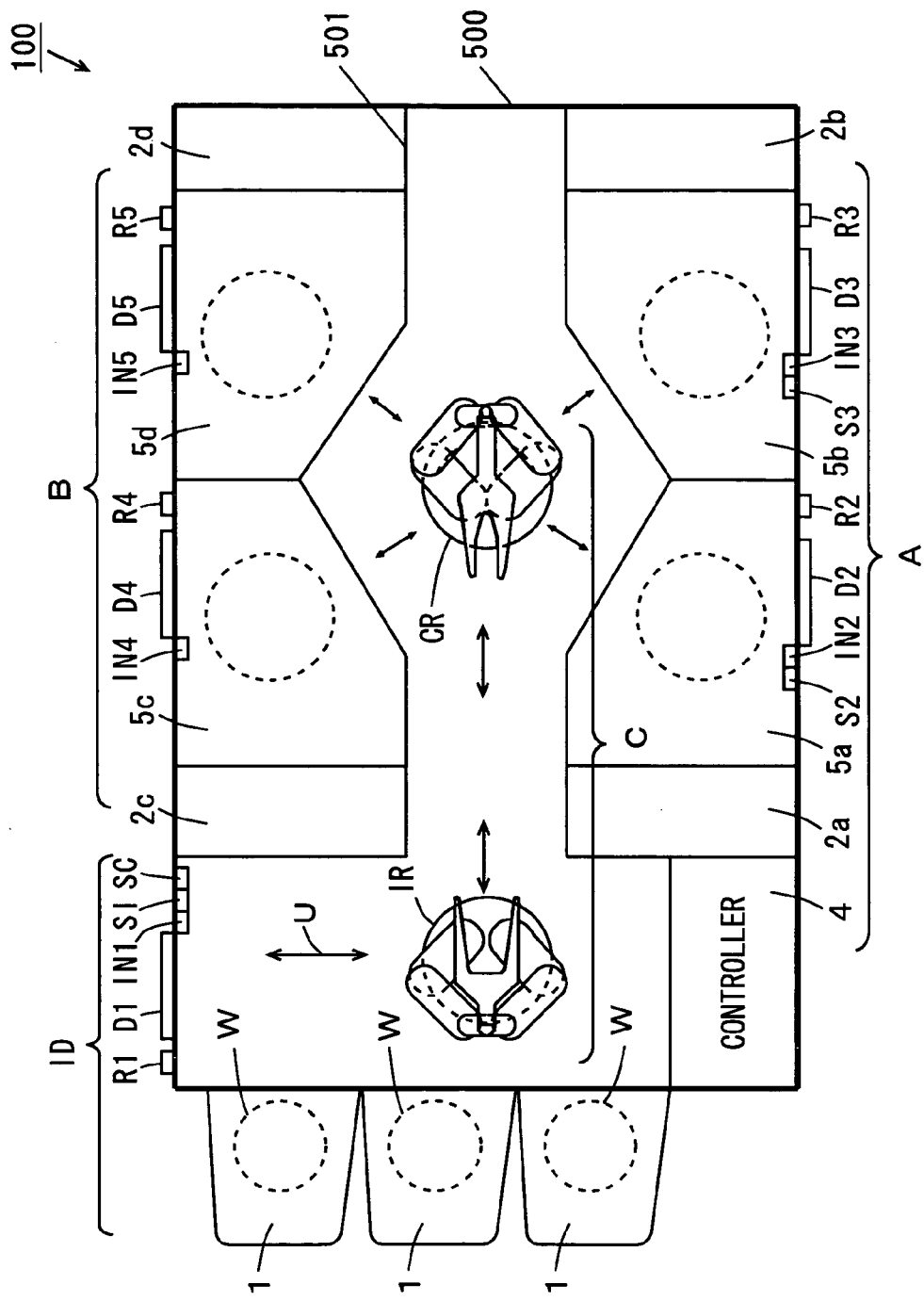
FIG. 1 is a plan view of a substrate processing apparatus according to an embodiment of the present invention.

FIG. 1 is a plan view of a substrate processing apparatus according to an embodiment of the present invention. As shown in FIG. 1, the substrate processing apparatus 100 has process regions A, B, and a transport region C between them. A plurality of processing units for performing specific processings to substrates W are disposed in each of the process regions A, B. Also, an indexer robot IR and a substrate transport robot CR for transporting the substrates W are disposed in the transport region C.

The plurality of processing units, indexer robot IR, and substrate transport robot CR will, hereinafter, be collectively termed operation units. Note that any operation unit that performs operation with respect to a substrate maybe used other than those mentioned here.

In the substrate processing apparatus 100, an operator performs a variety of maintenance work for each operation unit, among which is teaching for controlling the operating states of the operation units disposed in the process regions A, B, and transport region C.

Space including the process regions A, B, and transport region C will be called an apparatus space 500. A partition wall 501 is provided for separation of the process regions A, B, and transport region C, respectively.

At given positions on the sides of the substrate processing apparatus 100, doors D1, D2, D3, D4, D5 are provided in order for the operator to enter the apparatus space 500. The door D1 is associated with the indexer robot IR and the substrate transport robot CR, and the doors D2 to D5 are associated with the processing units, respectively.

The doors D1 to D5 are provided with interlock switches IN1, IN2, IN3, IN4, IN5, respectively, for turning off the entire substrate processing apparatus 100 in response to the opening of the doors D1 to D5 by the operator (hereinafter referred to as an interlock function). As an example, upon opening of any of the doors D1 to D5 by the operator, a corresponding one of the interlock switches IN1 to IN5 operates to turn off the entire substrate processing apparatus 100.

Near the respective doors D1 to D5 are provided interlock release units R1, R2, R3, R4, R5 for disabling the interlock function, and simultaneously, placing specific operation units of the entire operation units inside the apparatus space 500 in an off state, while maintaining the rest of the operation units in an on state (hereinafter referred to as a selective release function).

The specific operation units here are determined based on the influence that they have on the human body during the operation. The specific operation units are defined, for example, as being potentially harmful to the human body during the operation.

The operator can enable the selective release function by manipulating any of the interlock release units R1 to R5. This disables the interlock function, placing the specific operation units in an off state while maintaining the other operation units in an on state. As a result, the operator can open any of the doors D1 to D5 to enter the apparatus space 500 without exposure to the potential danger caused by the operation of the specific operation units.

With such selective release function being enabled, the specific operation units are in an off state while the other operation units without the danger of harming the human body are held in an on state, so that even an operator without special training on the specific operation units can perform maintenance of the other operation units. The selective release function and specific operation units will be detailed later.

At given positions on the sides of the substrate processing apparatus 100, re-operation instruction units SI, SC, S2, S3 are additionally provided for placing the specific operation units that has been placed in an off state by the selective release function back in an on state (hereinafter referred to as a re-operation instruction function).

The re-operation instruction units SI, SC, S2, S3 are provided for the specific operation units associated with them, respectively. The associated relationship will be described later.

When the entire substrate processing apparatus 100 is in an off state by the interlock function, the operator can perform maintenance by manipulating any of the re-operation instruction functions SI, SC, S2, S3 associated with a specific operation unit targeted for maintenance, thereby enabling the re-operation instruction function to turn on the specific operation unit again.

Note that each of the re-operation instruction functions SI, SC, S2, S3 places only its own associated specific operation unit in an on state. In other words, upon manipulation of one of the re-operation instruction units SI, SC, S2, S3 by the operator, only the specific operation unit associated with the manipulated re-operation instruction unit is turned on. As a result, the security of the operator is ensured, because the other operation units except the one targeted for maintenance do not operate.

Now, each of the operation units disposed in the process regions A, B, and transport region C will be described.

A controller 4, fluid boxes 2a, 2b, and chemical processors 5a, 5b are disposed in the process region A. Each of the chemical processors 5a, 5b corresponds to the processing unit, and also to the specific operation unit described above.

The fluid boxes 2a, 2b of FIG. 1 house fluid related equipment, such as piping, joints, valves, flow meters, regulators, pumps, temperature controllers, and process liquid storage reservoirs for supply of chemical to the chemical processors 5a, 5b and for discharge of chemical from the chemical processors 5a, 5b, respectively.

The chemical processors 5a, 5b perform cleaning processing using a chemical (hereinafter referred to as chemical processing). In this embodiment, a hydrogen fluoride solution is employed as an example of the chemical.

The door D2, interlock switch IN2, and interlock release unit R2 are provided on the exterior side of the chemical processor 5a. On the interior side thereof is also provided the re-operation instruction unit S2 associated with the chemical processor 5a. The door D3, interlock switch IN3, and interlock release unit R3 are provided on the exterior side of the chemical processor 5b. On the interior side thereof is also provided the re-operation instruction unit S3 associated with the chemical processor 5b.

In other words, the interlock release units R2, R3 are provided external to the apparatus space 500. There-operation instruction units S2, S3 are provided internal to the apparatus space 500.

Fluid boxes 2c, 2d and water processors 5c, 5d are disposed in the process region B. Each of the water processors 5c, 5d corresponds to the processing unit, and also to the operation unit other than the specific operation units described above.

The fluid boxes 2c, 2d of FIG. 1 house fluid related equipment, such as piping, joints, valves, flow meters, regulators, pumps, temperature controllers, and process liquid storage reservoirs for supply of water to the water processors 5c, 5d and for discharge of water from the water processors 5c, 5d, respectively.

The water processors 5*c*, 5*d* perform cleaning processing using water. In this case, residual chemical on a substrate W after the chemical processing is washed off with water.

The door D4, interlock switch IN4, and interlock release unit R4 are provided on the external side of the water processor 5*c*. Also, the door D5, interlock switch IN5, interlock release unit R5 are provided on the external side of the water processor 5*d*.

In other words, the interlock release units R4, R5 are provided external to the apparatus space 500.

The indexer robot IR and substrate transport robot CR are disposed in the transport region C. Each of the indexer robot IR and substrate transport robot CR corresponds to the specific operation unit described above.

The indexer ID for loading and unloading the substrates W is disposed on one end of the process regions A, B. The indexer robot IR is provided inside the indexer ID. Carriers 1 that store the substrates W are mounted in the indexer ID. While in this embodiment, FOUPs that store the substrates W in a sealed state are used as the carriers 1, SMIF (Standard Mechanical Interface) pods, OCs (Open Cassettes), or the like may be used instead.

The indexer robot IR in the indexer ID moves in the direction of the arrow U to take out a substrate W from a carrier 1 and deliver it to the substrate transport robot CR. Reversely, the indexer robot IR receives the substrate W provided with a series of processings from the substrate transport robot CR to return it to the carrier 1.

The substrate transport robot CR transports the substrate W delivered from the indexer robot IR to a designated processing unit or transports the substrate W received from one processing unit to another processing unit or to the indexer robot IR.

The door D1, interlock switch IN1, and interlock release unit R1 are provided on the external side of the indexer ID. On the interior side of the indexer ID are also provided the re-operation instruction units SI, SC associated with the indexer robot IR and substrate transport robot CR, respectively.

In other words, the interlock release unit R1 is provided external to the apparatus space 500. The re-operation instruction units SI, SC are provided internal to the apparatus space 500. Note that the re-operation instruction units SI, SC may be provided near their associated indexer robot IR and substrate transport robot CR, respectively (i.e., at given positions on the side of the substrate processing apparatus 100 and on the partition wall 501).

In this embodiment, a substrate W after the chemical processing in either of the chemical processors 5*a*, 5*b* is carried out of the chemical processor 5*a* or 5*b* by the substrate transport robot CR to be delivered into either of the water processors 5*c*, 5*d*.

The controller 4, which is composed of a computer including a CPU (Central Processing Unit) or the like, controls the operations of the each of the processing units in the process regions A, B, the substrate transport robot CR in the transport region C, and the indexer robot IR in the indexer ID. The controller 4 will be detailed later.

The structure of each of the interlock release units R1 to R5 and re-operation instruction units SI, SC, S2, S3 will now be described.

Figure 2:
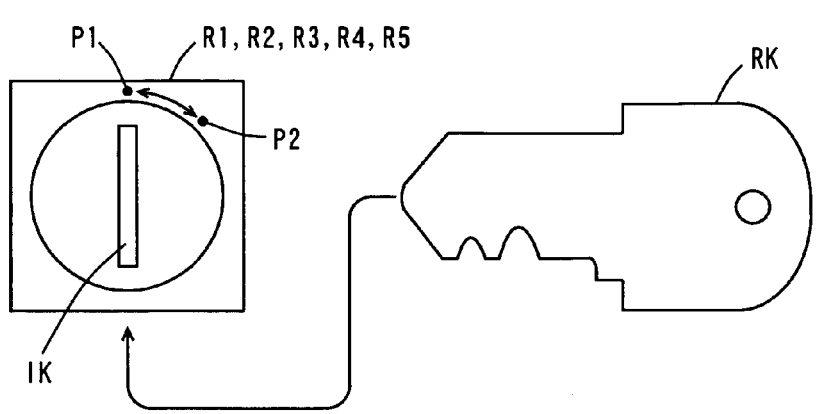
FIG. 2 is a diagram showing examples of interlock release units and re-operation instruction units according to an embodiment of the present invention.
Figure 2:
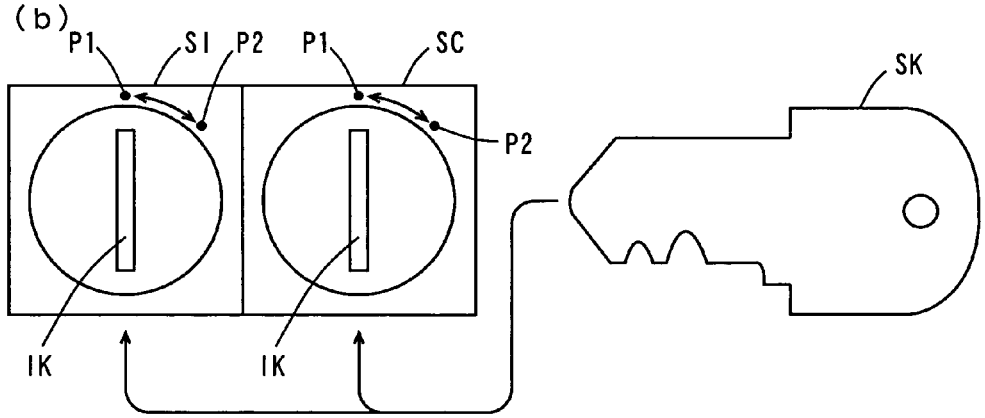
Figure 2:
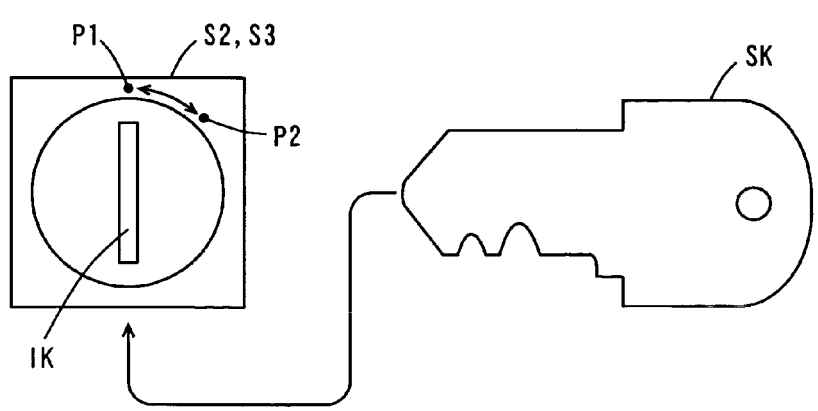

FIG. 2 is a diagram showing examples of the interlock release units R1 to R5 and re-operation instruction units SI, SC, S2, S3 according to an embodiment of the present invention.

As shown in FIG. 2(*a*), each of the interlock release units R1 to R5 is provided with a receiving hole IK which receives a selective release key RK, and also has two switch positions P1, P2. The selective release function is disabled with the key at the switch position P1, whereas being enabled at the switch position P2.

The operator inserts the selective release key RK into the receiving hole IK, and rotates the selective release key RK, thereby setting it to either of the switch positions P1, P2. This allows the selective release function to switch between an enabled state and a disabled state.

As shown in FIG. 2(*b*), the re-operation instruction units SI, SC, disposed next to each other, are provided with a receiving hole IK which receives a re-operation instruction key SK, and also has two switch positions P1, P2. The re-operation instruction function is disabled with the key at the switch position P1, whereas being enabled at the switch position P2.

The operator inserts the re-operation instruction key SK into the receiving hole IK, and rotates the re-operation instruction key SK, thereby setting it to either of the switch positions P1, P2. This allows the indexer robot IR and substrate transport robot CR associated with the respective re-operation instruction units SI, SC, i.e., the specific operation units, to switch between an enabled state and a disabled state.

As shown in FIG. 2(*c*), the re-operation instruction units S2, S3, disposed near their associated specific operation units, are each provided with a receiving hole IK which receives a re-operation instruction key SK, and also has two switch positions P1, P2. The re-operation instruction function is disabled with the key at the switch position P1, whereas being enabled at the switch position P2.

The operator inserts the re-operation instruction key SK into the receiving hole IK, and rotates the re-operation instruction key SK, thereby setting it to either of the switch positions P1, P2. This allows the chemical processors 5*a*, 5*b* associated with the respective re-operation instruction units S2, S3, i.e., the specific operation units, to switch between an enabled state and a disabled state.

Each of the interlock release units R1 to R5 and re-operation instruction units SI, SC, S2, S3 may not necessarily have the forgoing structure: it may have any other structure whereby its function is switched between an enabled and disabled state, such as a button.

As an alternative, the substrate processing apparatus 100 of FIG. 1 may comprise the following structure in which switching of the interlock function and selective release function is automatically performed, instead of the provision of the interlock release units R1 to R5.

The interlock function, which is activated upon opening of the doors D1 to D5, has a predetermined time during which it effectively operates, and the selective release function is set such that it is automatically activated after the elapse of a given time (e.g., 30 min).

In this case, even if the operator opens the doors D1 to D5 to activate the interlock function, he/she may close the doors D1 to D5 within the given time (e.g., 30 min) so as to disable the interlock function, and prevent the selective release function from effectively operating. As a result, the entire substrate processing apparatus 100 is turned on again after it has been turned off by the interlock function.

On the other hand, when the operator do not close the doors D1 to D5 within a given time (e.g., 30 min) after having opened the doors D1 to D5 for activation of the interlock function, the selective release function is effectively operated after the given time (e.g., 30 min). As a result, the specific operation units are held in an off state, while the other operation units are placed in an on state.

In the foregoing structure, the re-operation instruction function by the manipulation of the re-operation instruction units SI, SC, S2, S3 by the operator may effectively operate during the operation of the interlock function, whether or not the selective release function has been effectively operated.

Power supply states in the entire substrate processing apparatus 100 by the interlock function, selective release function, and re-operation instruction function will be described with reference to FIGS. 3 to 5.

Figure 3:
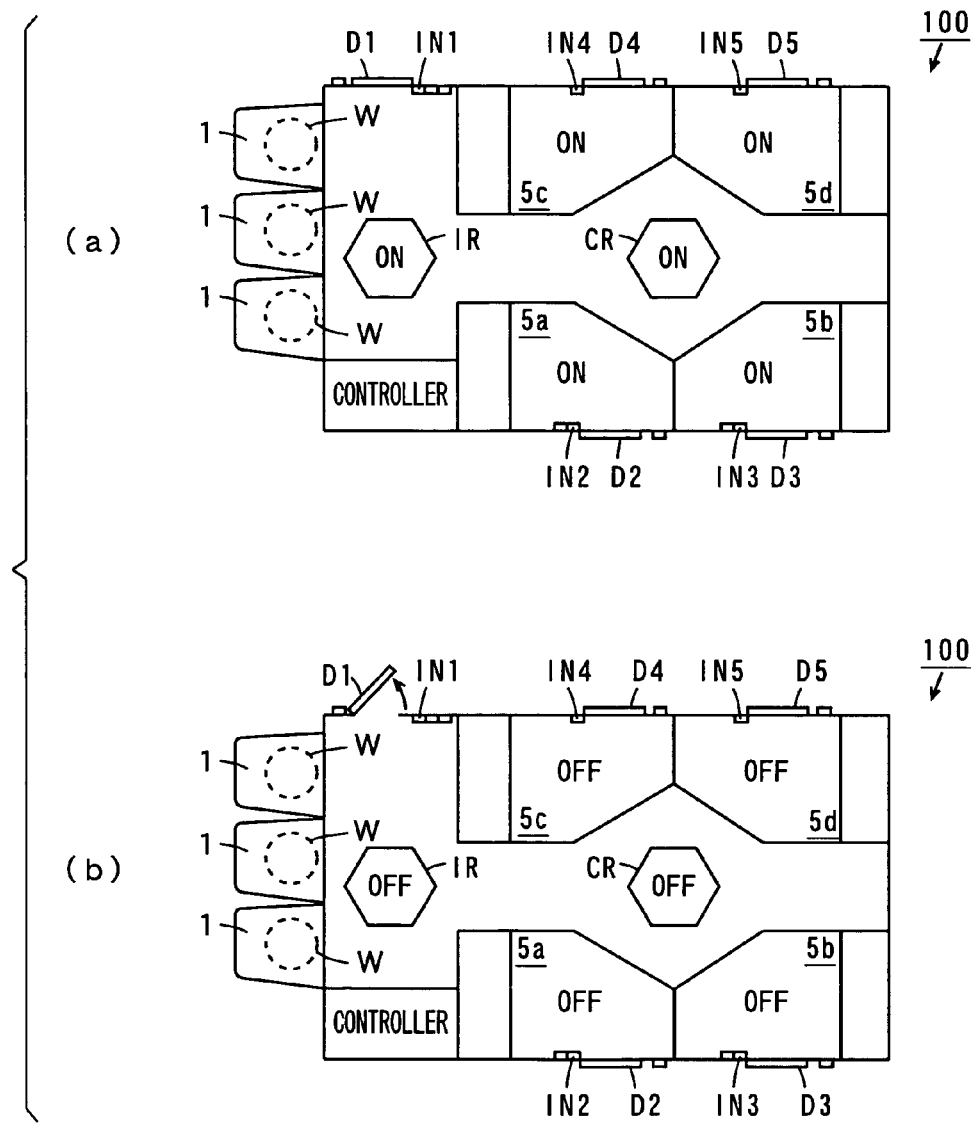
FIG. 3 is a diagram showing a power supply state in the entire substrate processing apparatus when the interlock function is effectively operating.

FIG. 3 is a diagram showing a power supply state in the entire substrate processing apparatus 100 when the interlock function is effectively operating.

It is assumed, as shown in FIG. 3(a), that all of the operation units (chemical processors 5a, 5b, water processors 5c, 5d, indexer robot IR, and substrate transport robot CR) are in an on state.

When the door D1 (or any of the doors D1 to D5) is opened as shown in FIG. 3(b), the interlock function effectively operates upon opening of the door D1. This turns off all of the operation units in the substrate processing apparatus 100.

Figure 4:
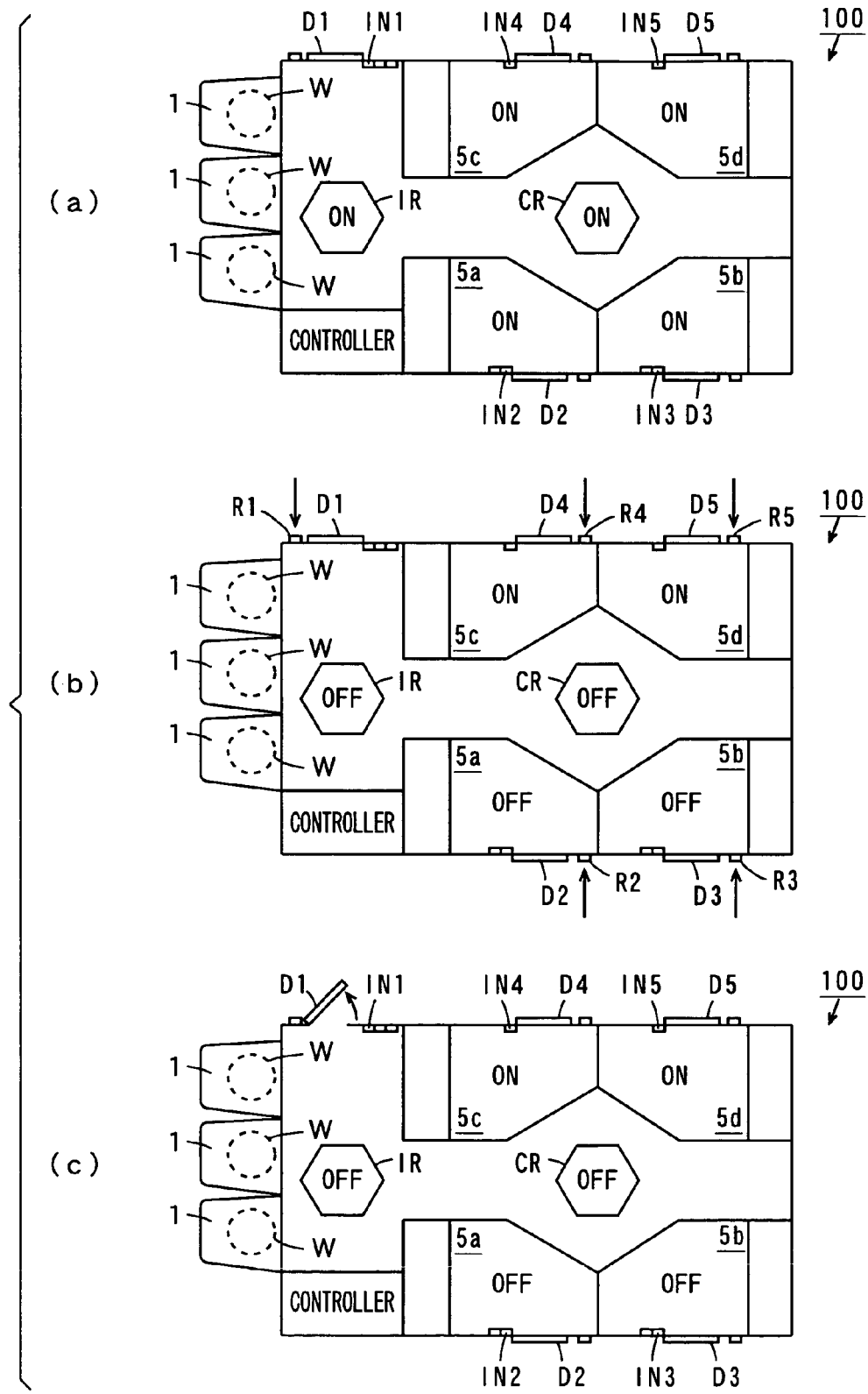
FIG. 4 is a diagram showing a power supply state in the entire substrate processing apparatus when the selective release function is effectively operating.

FIG. 4 is a diagram showing a power supply state in the entire substrate processing apparatus when the selective release function is effectively operating.

It is assumed, as shown in FIG. 4(a), that all of the operation units in the substrate processing apparatus 100 are in an on state.

When the selective release function is enabled at any of the interlock release units R1 to R5, as shown in FIG. 4(b), the specific operation units, i.e., the chemical processors 5a, 5b, indexer robot IR, and substrate transport robot CR are turned off. Meanwhile, the other operation units, i.e., the water processors 5c, 5c remain in an on state.

In addition, the interlock function is disabled by the selective release function, as shown in FIG. 4(c), so that the power supply state in each of the operation units does not change, even if the door D1 (or any of doors D1 to D5) is opened. In other words, the water processors 5c, 5d are not turned off.

Figure 5:
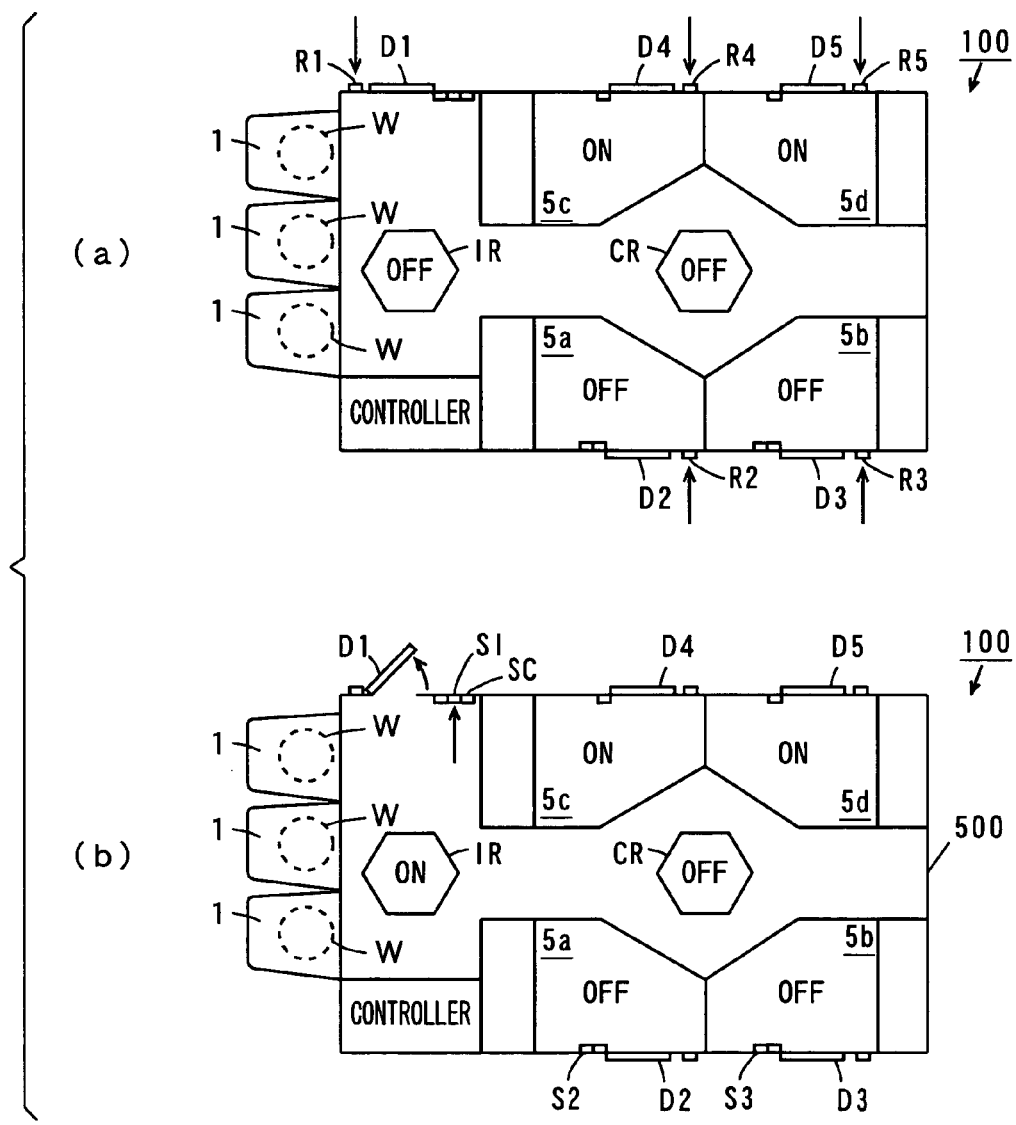
FIG. 5 is a diagram showing a power supply state in the entire substrate processing apparatus when the selective release function and re-operation instruction function are effectively operating.

FIG. 5 is a diagram showing a power supply state in the entire substrate processing apparatus 100 when the selective release function and re-operation instruction function are effectively operating.

It is assumed, as shown in FIG. 5(a), that upon enabling the selective release function at any of the interlock release units R1 to R5, the specific operation units are turned off, while the other operation units are in an on state.

In this case, although any of the doors D1 to D5 is opened, the power supply state shown in FIG. 5(a) does not change, as described above.

When the operator enables the re-operation instruction function at the re-operation instruction unit SI inside the apparatus space 500, as shown in FIG. 5(b), the specific operation unit associated with the re-operation instruction unit SI, the indexer robot IR, is turned on again. Meanwhile, each of the operation units except the indexer robot IR maintains its power-supply state as shown in FIG. 5(a).

Similarly, by enabling the re-operation instruction function with respect to each of the re-operation instruction units SC, S2, S3, the operator can turn on only the specific operation unit associated with each of them.

The specific operation units will be described. In the substrate processing apparatus 100 according to the embodiment, danger levels are set for the respective operation units. The danger levels are determined, for example, based on the possibility of harming the operator's body during the operations of the respective operation units.

In the substrate processing apparatus 100 according to the embodiment, the indexer robot IR, substrate transport robot CR, chemical processors 5a, 5b, and water processors 5c, 5d are the operation units to be assigned danger levels.

In addition to those above, a processor using a laser and the like may be provided as an operation unit in the process regions A, B, and transport region C of the substrate processing apparatus 100.

A processor using a laser performs such processings as irradiation of peripheral portion of the substrate W with a given laser. JIS (Japanese Industrial Specification) C 6802 provides the classification of lasers, in which a second class laser, for example, is defined as having power whose damage to a human body is avoidable by defense reaction.

FIG. 6 is a diagram illustrative of an example of danger levels according to an embodiment of the present invention.

As shown in FIG. 6, the operation units are classified into "level1", "level2", "level3", and "level4", respectively, in order of smaller influence that the operation of each of the operation units may have on a human body.

Level 1 operation units include those without possibility of harming a human body during the operation, e.g., water processors.

Level 2 operation units include those having a low possibility of harming a human body during the operation, e.g., chemical processors using chemicals with a low possibility of harming a human body.

Level 3 operation units include those having a possibility of harming a human body during the operation, e.g., chemical processors using chemicals with a high possibility of harming a human body, and processors using lasers of the second or higher class.

Level 4 operation units include those having a very high possibility of harming a human body during the operation, e.g., various types of transport robots that transport the substrates W.

Accordingly, danger levels are set for the respective operation units in the substrate processing apparatus 100 of FIG. 1 as follows: The water processors 5c, 5d belong to the level 1, the chemical processors 5a, 5b using a hydrogen fluoride solution having a high possibility of harming a human body to the level 3, and the indexer robot IR and substrate transport robot CR to the level 4.

The specific operation units are determined, for example, by setting a level of threshold among the above four danger levels.

Referring to FIG. 6, with the level of threshold set to the danger level 3 or higher, the chemical processors using chemicals having a high possibility of harming a human body, the processors using lasers of the second or higher class, and the various types of transport robots are determined as the specific operation units.

In other words, the chemical processors 5a, 5b, indexer robot IR, and substrate transport robot CR are determined as the specific operation units in the substrate processing apparatus 100 of FIG. 1.

Such danger levels may be classified into a greater number of levels without restricted to the example of FIG. 6, and correspondingly, the level of threshold may be set as desired.

While in the above case, the danger levels are determined based on the possibility of harming the body of an operator during the operations of the operation units, they may be determined based on the assumed extent or frequency of damage to the body of an operator during the operations of the operation units.

Figure 7:
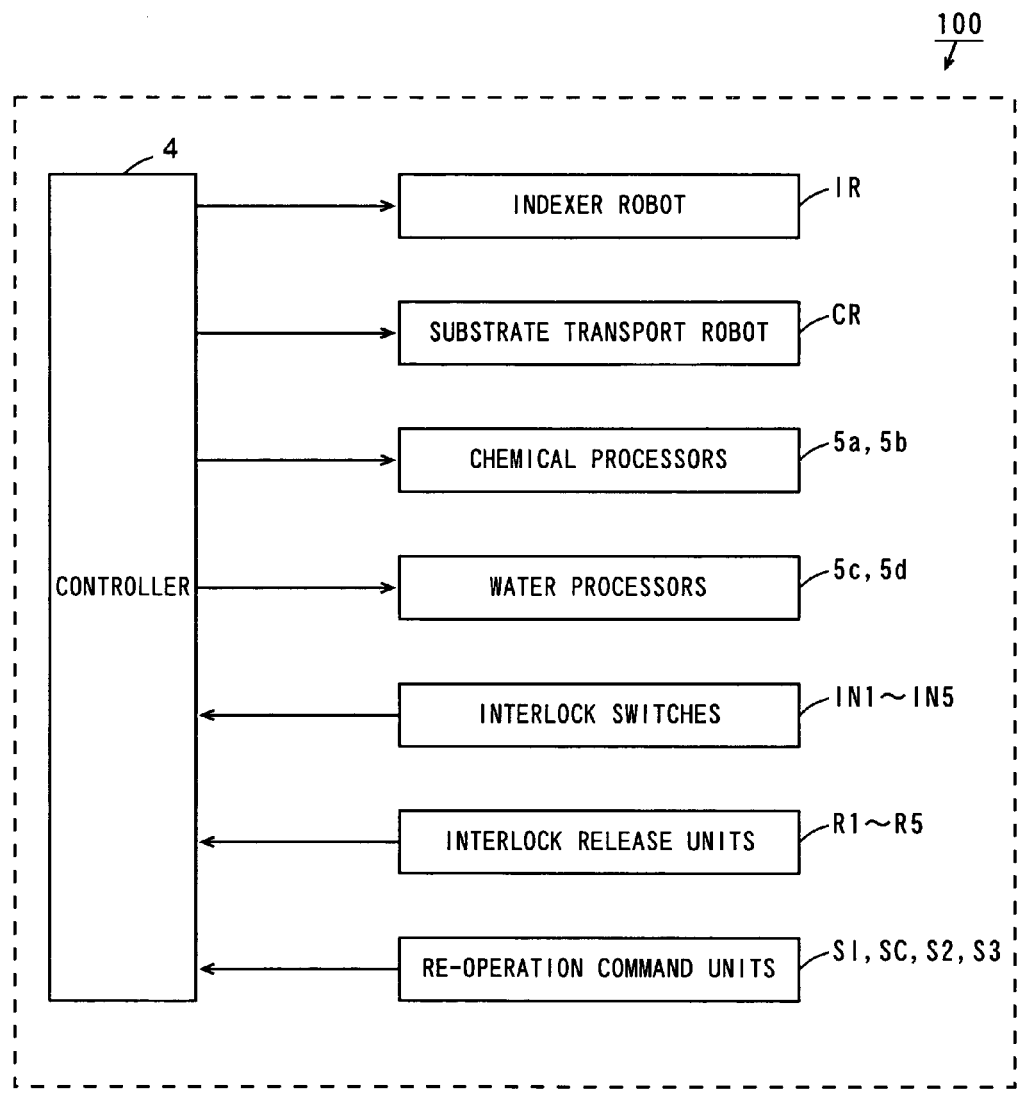
FIG. 7 is a block diagram showing the structure of a control system in the substrate processing apparatus of FIG. 1.

FIG. 7 is a block diagram showing the structure of a control system in the substrate processing apparatus of FIG. 1.

The controller 4 controls the operations of the indexer robot IR and substrate transport robot CR, and also controls the cleaning operations of the chemical processors 5a, 5b and water processors 5c, 5d.

The controller 4 further controls the power supply to the indexer robot IR, substrate transport robot CR, chemical processors 5a, 5b, and water processors 5c, 5d in response to the operation of the interlock switches IN1 to IN5.

The controller 4 is also responsive to a signal that enables the selective release function by the user manipulation of the interlock release units R1 to R5, while being not responsive to the operation of the interlock switch IN1 to IN5. Simultaneously, the controller 4 controls the chemical processors 5a, 5b, indexer robot IR, and substrate transport robot CR in an off state, while maintaining the water processors 5c, 5d in an on state.

Add to this, while the foregoing selective release function is effectively operating, the controller 4 is responsive to a signal that enables the re-operation instruction function by the user manipulation of any of the re-operation instruction units SI, SC, S2, S3, to control the specific operation unit associated with the manipulated re-operation instruction unit in an on state again.

As described above, the substrate processing apparatus 100 may include processors using lasers instead of the chemical processors 5a, 5b and water processors 5c, 5d.

In the case where the substrate processing apparatus 100 has the structure without the interlock release units R1 to R5 as described above, the controller 4 controls the power supply to the indexer robot IR, substrate transport robot CR, chemical processors 5a, 5b, and water processors 5c, 5d in response to the operation of the interlock switches IN1 to IN5, and also counts a given time.

Upon the elapse of a given time, the controller 4 then controls the chemical processors 5a, 5b, indexer robot IR, and substrate transport robot CR in an off state, while maintaining the water processors 5c, 5d in an on state.

In the substrate processing apparatus 100 according to this embodiment, upon opening of any of the doors D1 to D5, each operation unit of the entire substrate processing apparatus 100 is turned off by the interlock function. However, the manipulation of the interlock release units R1 to R5 by the operator before opening the doors D1 to D5 disables the interlock function, and also places the specific operation units in an off state. This prevents the potential danger to the operator caused by the operation of the specific operation units, thereby ensuring the security of the operator.

With the specific operation units being turned off, an operator without special training on the specific operation units can also safely perform maintenance of the other operation units, when he/she wishes to. As a result, the maintenance can be efficiently performed.

The operator may also activate the re-operation instruction function by manipulating the re-operation instruction units SI, SC, S2, S3 to place the specific operation units in an on state. This allows the operator to perform maintenance of the specific operation units.

The substrate processing apparatus 100 according to this embodiment may alternatively have a structure in which switching of the interlock function and selective release function is automatically performed, as described above.

In this case, upon opening of the doors D1 to D5, each operation unit of the entire substrate processing apparatus 100 is turned off, and then after the elapse of a given time since opening of the doors D1 to D5, the interlock function is disabled, the specific operation units are turned off, and the other operation units are turned on. This prevents the potential danger to the operator caused by the operation of the specific operation units, thereby ensuring the security of the operator. With the specific operation units out of operation, even an operator without special training on the specific operation units can perform maintenance of the other operation units safely, when he/she wishes to. As a result, the maintenance can be efficiently performed.

Moreover, the operator may activate the re-operation instruction function by manipulating the re-operation instruction units SI, SC, S2, S3 to place the specific operation units in an on state again. This allows the operator to perform maintenance of the specific operation units.

In this embodiment, the danger levels are preset for the plurality of operation units in the substrate processing apparatus 100. With the preset specific danger levels, the operation units are classified into specific operation units and other operation units according to the possibility of harming the body of an operator.

In this case, upon opening of the doors D1 to D5, the plurality of operation units in the entire substrate processing apparatus 100 are turned off by the interlock function. However, before or after the opening of the doors D1 to D5 by the operator, the interlock function is disabled by the selective release function, and simultaneously, the specific operation units having higher danger levels of the plurality of operation units are placed in an off state. This prevents the potential danger to the operator caused by the operation of the specific operation units having higher danger levels, thereby ensuring the security of the operator.

With the specific operation units having higher danger levels being turned off, even an operator without special training on the specific operation units of higher danger levels can perform maintenance of the other operation units safely, when he/she wishes to. As a result, the maintenance can be efficiently performed.

Moreover, the operator may activate the re-operation instruction function by manipulating the re-operation instruction units SI, SC, S2, S3 to place the specific operation units having higher danger levels in an on state again. This allows the operator to perform maintenance of the specific operation units with higher danger levels.

In this embodiment, the specific operation units include the indexer robot IR and substrate transport robot CR. In this case, the operator can perform maintenance of the indexer robot IR and substrate transport robot CR with the re-operation instruction function.

Also, an operator without special training on the indexer robot IR and substrate transport robot CR can safely perform maintenance of the operation units other than the indexer robot IR and substrate transport robot CR, when he/she wishes to. As a result, the maintenance can be efficiently performed.

The specific operation units also include the chemical processors 5a, 5b. In this case, the operator can perform maintenance of the chemical processors 5a, 5b with the re-operation instruction function.

An operator without special training on the chemical processors 5a, 5b can also safely perform maintenance of the operation units other than the chemical processors 5a, 5b, when he/she wishes to. As a result, the maintenance can be efficiently performed.

The specific operation units additionally include the processors using lasers of the second or higher class. In this case, the operator can perform maintenance of the processors using such lasers with the re-operation instruction function.

An operator without special training on the processors using the lasers can also safely perform maintenance of the operation units other than the processors using the lasers, when he/she wishes to. As a result, the maintenance can be efficiently performed.

The substrate processing apparatus 100 of FIG. 1 comprises the plurality of specific operation units with the re-operation instruction units SI, SC, S2, S3 provided for the specific operation units, respectively.

In this case, provision of the re-operation instruction units SI, SC, S2, S3 for the respective specific operation units prevents the operator from erroneously re-operating specific operation units other than the specific operation unit of which he/she is to perform maintenance.

In the foregoing embodiment of the present invention, the substrate processing apparatus 100 corresponds to a substrate processing apparatus; the process regions A, B correspond to a process space; the transport region C corresponds to a transport space; the apparatus space 500 corresponds to an apparatus space; the doors D1 to D5 correspond to a door; the interlock switches IN1 to IN5, interlock function, and controller 4 correspond to a stop device.

The operation units in the entire substrate processing apparatus 100, i.e., chemical processors 5a, 5b, water processors 5c, 5d, indexer robot IR, substrate transport robot CR, and processors using lasers, correspond to a plurality of operation units; the specific operation units, i.e., chemical processors 5a, 5b, indexer robot IR, substrate transport robot CR, and processors using lasers, correspond to a predetermined operation unit; the interlock switches IN1 to IN5, selective release key RK, interlock release units R1 to R5, selective release function, and controller 4 correspond to a disabling device; and the re-operation instruction key SK, re-operation instruction units SI, SC, S2, S3, re-operation instruction function, and controller 4 correspond to an operation instruction device.

The indexer robot IR and substrate transport robot CR correspond to a transport device; the chemical processors 5a, 5b correspond to a processor that performs processing using a chemical; and the processors using lasers correspond to a processor that performs processing using laser light.

The re-operation instruction key SK and re-operation instruction units SI, SC, S2, S3 correspond to a first manipulator, and the selective release key RK and interlock release units R1 to R5 correspond to a second manipulator.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate processing apparatus comprising:
a plurality of operation units provided in an apparatus space, including a process space for performing a given process on a substrate and a transport space for transporting the substrate, to perform a given process or a transport operation on the substrate;
a door that allows a person to enter into said apparatus space;
a stop device that stops said plurality of operation units upon opening of said door;
a disabling device for placing the operation of said stop device in a disabled state, while placing a predetermined operation unit of said plurality of operation units in a stopped state; and
an operation instruction device for re-operating said predetermined operation unit that has been placed in a disabled state by said disabling device;
wherein danger levels are preset for said plurality of operation units, respectively, and said predetermined operation unit has a danger level higher than that of the other operation units.

2. The substrate processing apparatus according to claim 1, wherein
said operation instruction device further comprises a first manipulator for instructing the re-operation of said predetermined operation unit that has been placed in a stopped state,
said first manipulator being provided in said apparatus space.

3. The substrate processing apparatus according to claim 1, wherein
said disabling device comprises a second manipulator for instructing settings of the operations of said stop device and said predetermined operation unit,
said second manipulator being provided outside said apparatus space.

4. The substrate processing apparatus according to claim 1, further comprising a controller that controls the operation of said stop device in a disabled state while controlling said predetermined operation unit in a stopped state in response to the settings made by said disabling device, and re-operates said predetermined operation unit in response to the instruction of re-operation by said operation instruction device.

5. The substrate processing apparatus according to claim 1, wherein
said predetermined operation unit includes a transport device that transports a substrate.

6. The substrate processing apparatus according to claim 1, wherein
said predetermined operation unit includes a processor that performs processing using a chemical.

7. The substrate processing apparatus according to claim 1, wherein
said predetermined operation unit includes a processor that performs processing using laser light.

8. The substrate processing apparatus according to claim 1, wherein
said predetermined operation unit includes a plurality of operation units, and said operation instruction device includes a plurality of operation instruction devices provided for said plurality of operation units, respectively.

9. A substrate processing apparatus comprising:
a plurality of operation units provided in an apparatus spaces including a process space for performing a given process on to a substrate and a transport space for transporting the substrate, to perform a given processing or a transport operation on the substrate;
a door that allows a person to enter into said apparatus space;
a stop device that stops said plurality of operation units upon opening of said door;
a disabling device that places the operation of said stop device in a disabled state, while placing a predetermined operation unit of said plurality of operation units in a stopped state after the elapse of a given time since the opening of said door; and an operation instruction device for re-operating said predetermined operation unit that has been placed in a stopped state by said disabling device;

wherein danger levels are preset for said plurality of operation units, respectively, and said predetermined operation unit has a danger level higher than that of the other operation units.

10. The substrate processing apparatus according to claim 9, wherein said operation instruction device further comprises a first manipulator for instructing the re-operation of said predetermined operation unit that has been placed in a stopped state, said first manipulator being provided in said apparatus space.

11. The substrate processing apparatus according to claim 9, further comprising a controller that controls the operation of said stop device in a disabled state while controlling said predetermined operation unit in a stopped state in response to the settings made by said disabling device, and re-operates said predetermined operation unit in response to the instruction of re-operation by said operation instruction device.

12. The substrate processing apparatus according to claim 9, wherein said predetermined operation unit includes a transport device that transports a substrate.

13. The substrate processing apparatus according to claim 9, wherein said predetermined operation unit includes a processor that performs processing using a chemical.

14. The substrate processing apparatus according to claim 9, wherein said predetermined operation unit includes a processor that performs processing using laser light.

15. The substrate processing apparatus according to claim 9, wherein said predetermined operation unit includes a plurality of operation units, and said operation instruction device includes a plurality of operation instruction devices provided for said plurality of operation units, respectively.

16. A management method performed on a substrate processing apparatus that includes a plurality of operation units provided in an apparatus space including a process space for performing given processing to a substrate and a transport space for transporting the substrate, to perform a given processing or a transport operation to the substrate, a door that allows a person to enter into said apparatus space, and a stop device that stops said plurality of operation units upon opening of said door, said management method comprising the steps of:

placing the operation of said stop device in a disabled state while placing a predetermined operation unit of said plurality of operation units in a stopped state; and re-operating said predetermined operation unit that has been placed in a stopped state;

wherein danger levels are preset for said plurality of operation units, respectively, and said predetermined operation unit has a danger level higher than that of the other operation units.

17. A management method performed on a substrate processing apparatus that includes a plurality of operation units provided in an apparatus space including a process space for performing a given process on a substrate and a transport space for transporting the substrate, to perform a given process or a transport operation on the substrate, a door that allows a person to enter into said apparatus space, and a stop device that stops said plurality of operation units upon opening of said door, said management method comprising the steps of:

placing the operation of said stop device in a disabled state while placing a predetermined operation unit of said plurality of operation units in a stopped state after the elapse of a given time since the opening of said door; and re-operating said predetermined operation unit that has been placed in a stopped state;

wherein danger levels are preset for said plurality of operation units, respectively, and said predetermined operation unit has a danger level higher than that of the other operation units.

* * * * *